(12) United States Patent
An et al.

(10) Patent No.: US 7,551,030 B2
(45) Date of Patent: Jun. 23, 2009

(54) TWO-STAGE OPERATIONAL AMPLIFIER WITH CLASS AB OUTPUT STAGE

(75) Inventors: Chang Ho An, Hwaseong-si (KR); Si Wang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/972,339

(22) Filed: Jan. 10, 2008

(65) Prior Publication Data

US 2008/0191804 A1 Aug. 14, 2008

(30) Foreign Application Priority Data

Feb. 8, 2007 (KR) ........................ 10-2007-0013429
Aug. 16, 2007 (KR) ........................ 10-2007-0082244

(51) Int. Cl.
*H03F 3/45* (2006.01)
(52) U.S. Cl. ........................ 330/255; 330/261
(58) Field of Classification Search ................. 330/255, 330/261, 257, 253
See application file for complete search history.

(56) References Cited

U.S. PATENT DOCUMENTS 6,384,685 B1 * 5/2002 Juang ........................ 330/264
6,486,736 B2 11/2002 Cusinato et al.
6,717,468 B1 4/2004 Jeong et al.
7,453,318 B2 * 11/2008 Higuchi ........................ 330/255
7,474,152 B2 * 1/2009 Hatanaka ..................... 330/255
7,489,193 B2 * 2/2009 Adachi ........................ 330/253

FOREIGN PATENT DOCUMENTS

JP 20030229725 8/2003
KR 1020040018838 A 3/2004

* cited by examiner

*Primary Examiner*—Henry K Choe
(74) *Attorney, Agent, or Firm*—F. Chau & Assoc., LLC

(57) ABSTRACT

An operational amplifier includes a differential amplifier including an active load, a current mirror including a first branch and a second branch, a first switch connected between a first power source and an output node and switched in response to a voltage of a first output terminal of the differential amplifier, a first bias circuit to control an amount of a reference current flowing in the first branch in response to a voltage of a second output terminal of the differential amplifier, a second bias circuit to control a voltage of the second branch in which a mirror current flows, in response to a voltage of the first output terminal, a second switch connected between the output node and a second power source and switched in response to a voltage of the second branch, and a capacitor connected between the output node and the first output terminal.

4 Claims, 7 Drawing Sheets

TWO-STAGE OPERATIONAL AMPLIFIER WITH CLASS AB OUTPUT STAGE

CROSS-REFERENCE TO RELATED PATENT APPLICATIONS

This application claims the benefit of Korean Patent Application Nos. 10-2007-0013429, filed on Feb. 8, 2007 and 10-2007-0082244, filed Aug. 16, 2007 in the Korean Intellectual Property Office, the disclosures of which are incorporated herein in their entirety by reference.

BACKGROUND OF THE INVENTION

1. Technical Field

The present disclosure relates to an operational amplifier (OP AMP) and, more particularly, to a two-stage OP AMP having a class AB output stage.

2. Discussion of Related Art

A rail-to-rail OP AMP is mainly used to obtain an output voltage that swings fully from a ground voltage to a power voltage in an output buffer of a source driver to drive general electronic devices, for example, LCD (liquid crystal display) panels. Because the layout size of the rail-to-rail OP AMP is very large, however, the size of the output buffer of the source driver including a plurality of rail-to-rail OP AMPs increases as well. Thus, with the trend of decreasing the size of the source driver, there is a need to decrease the size of the OP AMP used for the output buffer of the source driver.

Although a two-stage OP AMP is used for the output buffer of the source driver, because the falling characteristic of the two-stage OP AMP is inferior, deviations are generated between signals output from the source driver. Thus, a vertical pattern or a wave pattern may be generated in the LCD panel image display due to the deviations. Also, when the two-stage OP AMP is used instead of the rail-to-rail OP AMP for the output buffer of the source driver, the falling characteristic or rising characteristic of the output voltage of the output buffer may be degraded.

Because the output stage of the rail-to-rail OP AMP is operated in class AB, the rail-to-rail OP AMP can operate the output load thereof in class AB (or push-pull). Because one side of the output stage of the two-stage OP AMP, for example, a pull-up circuit implemented by a PMOSFET, is operated as a common source amplifier while the other side, for example, a pull-down circuit implemented by an NMOSFET, is operated as a current source, it is difficult to operate the output load of the two-stage OP AMP in class AB (or push-pull). Thus, an OP AMP having a small layout size and that is capable of improving the falling characteristic or the rising characteristic is needed.

SUMMARY OF THE INVENTION

To solve the above and/or other problems, exemplary embodiments of the present invention provide a two-stage OP AMP that has a small layout size, improves a falling characteristic or a rising characteristic, and is capable of operating as if it is a rail-to-rail amplifier.

According to an exemplary embodiment of the present invention, an operational amplifier comprises a differential amplifier including an active load, a current mirror including a first branch and a second branch, a first switch connected between a first power source and an output node and switched in response to a voltage of a first output terminal of the differential amplifier, a first bias circuit to control the amount of a reference current flowing in the first branch in response to a voltage of a second output terminal of the differential amplifier, a second bias circuit to control a voltage of the second branch in which a mirror current flows, in response to a voltage of the first output terminal, a second switch connected between the output node and a second power source and switched in response to the voltage of the second branch, and a capacitor connected between the output node and the first output terminal.

The current mirror is an NMOSFET current mirror, the voltage of the first power source is higher than that of the second power source, the first switch is a PMOSFET, and the second switch is an NMOSFET. The current mirror is a PMOSFET current mirror, the voltage of the first power source is lower than that of the second power source, the first switch is a NMOSFET, and the second switch is a PMOSFET.

According to an exemplary embodiment of the present invention, an operational amplifier comprises a first current mirror connected between a first power source and a first control node and including a reference current branch and a mirror current branch, a second current mirror connected between a second power source and a second control node, a first transistor connected between the first power source and an output node and turned on/off in response to a voltage of the first control node, a second transistor connected between the output node and the second power source and turned on/off in response to a voltage of the second control node, a transistor pair of a third transistor connected to the second power source through a current source and having a drain connected to the reference current branch and a fourth transistor having a drain connected to the mirror current branch, a bias circuit connected between the first control node and a second control node and biasing the first transistor and the second transistor in response to a plurality of bias control voltages, and a capacitor connected between the mirror current branch and the output node.

The voltage of the first power source is higher than that of the second power sources the first current mirror is a PMOSFET cascode current mirror, the second current mirror is an NMOSFET current mirror, the first transistor is a PMOSFET, and the second, third, and fourth transistors are NMOSFETs.

The voltage of the first power source is lower than that of the second power source, the first current mirror is an NMOSFET cascode current mirror, the second current mirror is a PMOSFET current mirror, the first transistor is an NMOSFET, and the second, third, and fourth transistors are PMOSFETs. The operational amplifier is a unity gain buffer to which the output node and a gate of the third transistor are connected. The operational amplifier is implemented as a part of a display driving device.

BRIEF DESCRIPTION OF THE DRAWINGS

Exemplary embodiment of the present invention will be understood in more detail from the following descriptions taken in conjunction with the attached drawings, in which.

DETAILED DESCRIPTION OF EXEMPLARY EMBODIMENTS

Figure 1:
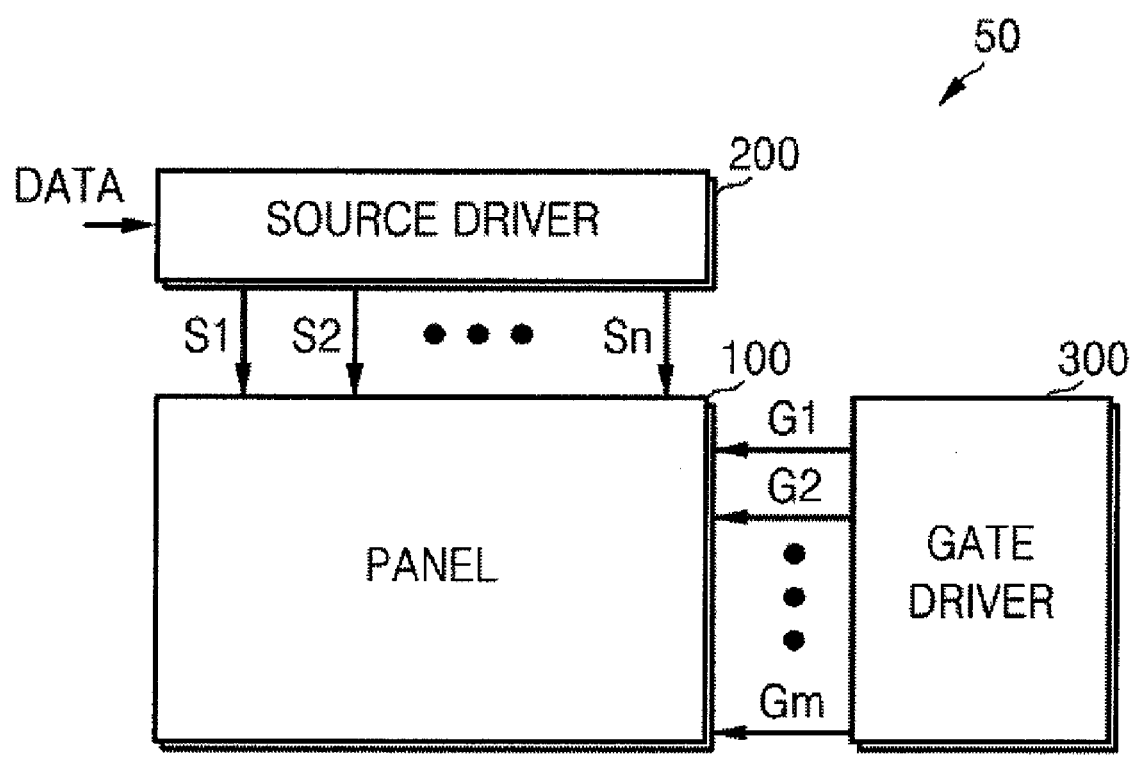
FIG. 1 is a block diagram of a display device including a source driver according to an exemplary embodiment of the present invention.

Hereinafter, the present invention will be described in detail by explaining exemplary embodiments of the invention with reference to the attached drawings. Like reference numerals in the drawings denote like elements.

FIG. 1 is a block diagram of a display device including a source driver according to an exemplary embodiment of the present invention. Referring to FIG. 1, a flat display device 50 such as an LCD (liquid crystal display) device, a PDP (plasma display panel) device, or an OLED (organic light emitting diode) device includes an LCD panel 100, a source driver 200, and a gate driver 300. The LCD panel 100 includes a plurality of gate lines G1-Gm, where "m" is a natural number, a plurality of source lines S1-Sn, where "n" is a natural number, and a plurality of pixels (not shown).

The source driver 200 or a data line driver drives the source lines S1-Sn in response to digital image data DATA. The gate driver 300 drives the gate lines G1-Gm. The pixels display a desired image based on the operations of the source driver 200 and the gate driver 300.

Figure 2:
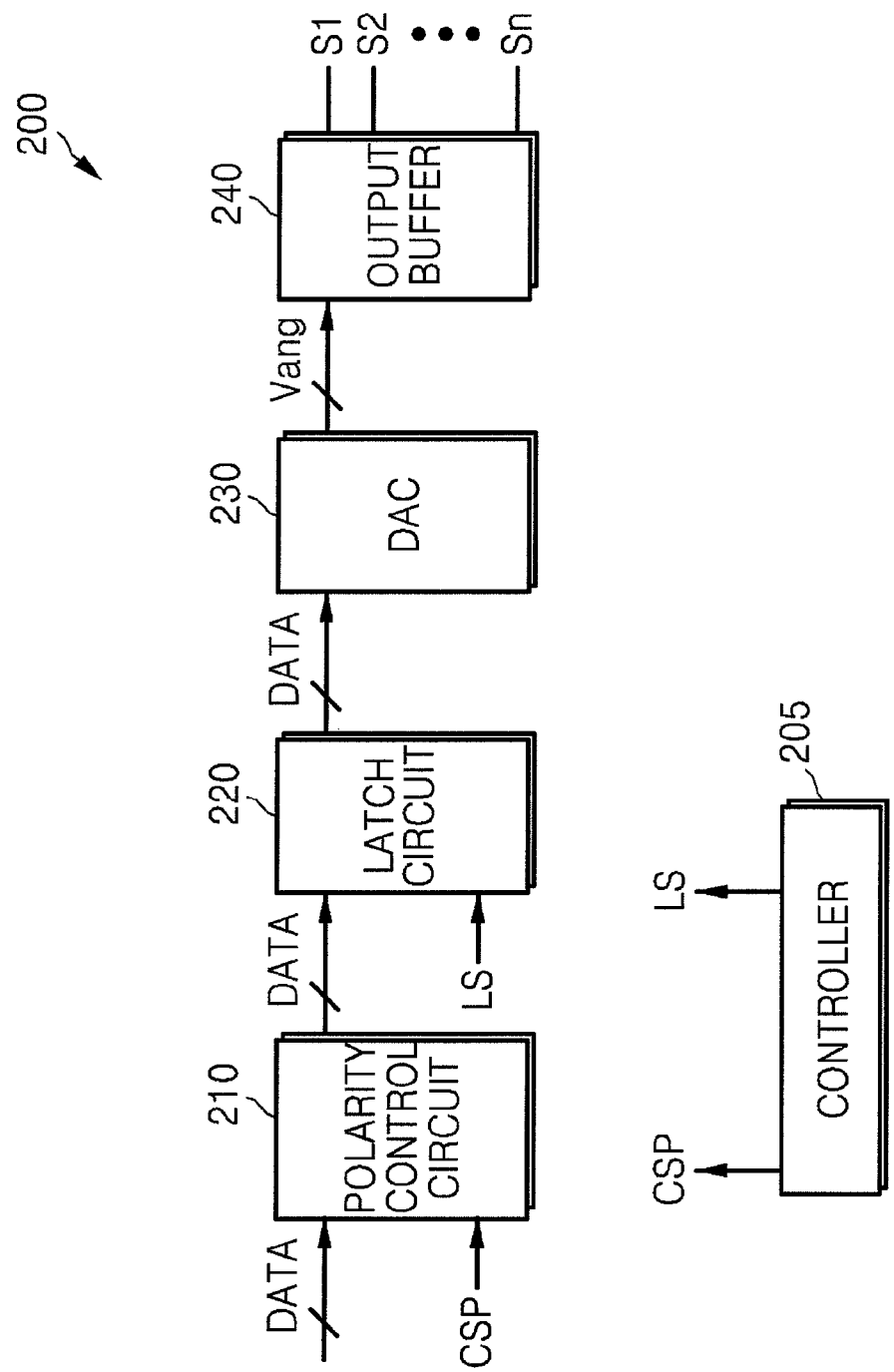
FIG. 2 is a block diagram of the source driver used in the device of FIG. 1.

FIG. 2 is a block diagram of the source driver 200 of FIG. 1. Referring to FIG. 2, the source driver 200 that is a display driving apparatus includes a controller 205, a polarity control circuit 210, a latch circuit 220, a digital-to-analog converter (DAC) 230, and an output buffer 240. The controller 205 can be implemented inside or outside the source driver 200 according to the kind of display device. The controller 205 generates a polarity control signal CSP and a latching signal LS.

When a constant voltage is continuously supplied to a plurality of liquid crystals of the LCD panel 100, the liquid crystals are likely to be hardened and degraded. Accordingly, to prevent the hardening of the liquid crystals of the LCD panel 100, the polarity control circuit 210 controls the polarity of the digital image data DATA in response to the polarity control signal CSP. The control of the polarity signifies reversing the phase of the digital image data DATA based on a common voltage supplied to the LCD panel 100 in a cycle.

The latch circuit 220 latches the digital image data DATA output from the polarity control circuit 210 in response to the latching signal LS. The DAC 230 converts the digital image data DATA output from the latch circuit 220 to a plurality of analog voltages Vang. The phase of each of the analog voltages Vang can be inverted in a cycle based on the common voltage.

The output buffer 240 includes a plurality of OP AMPs according to exemplary embodiments of the present invention which are shown in FIGS. 4-7. The output buffer 240 amplifies or buffers each of the analog voltages Vang and outputs each of the amplified voltages to a corresponding one of the source lines S1-Sn. The output buffer 240 in the source driver 200 includes a plurality of rail-to-rail OP AMPs to output the amplified or buffered voltage to each of the source lines S1-Sn.

Figure 4:
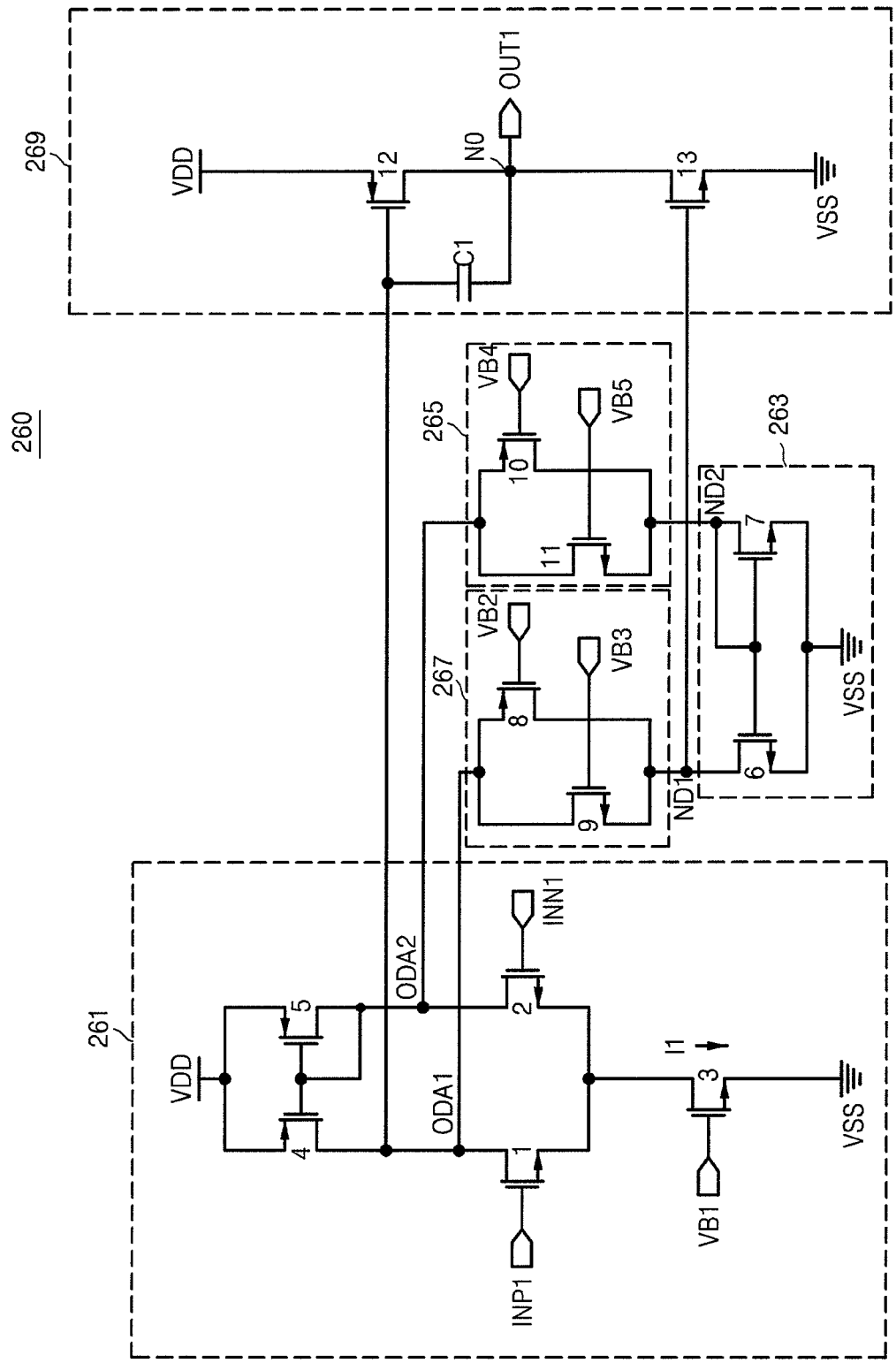
FIG. 4 is a circuit diagram of an OP AMP having an NMOSFET input stage according to an exemplary embodiment of the present invention.
Figure 5:
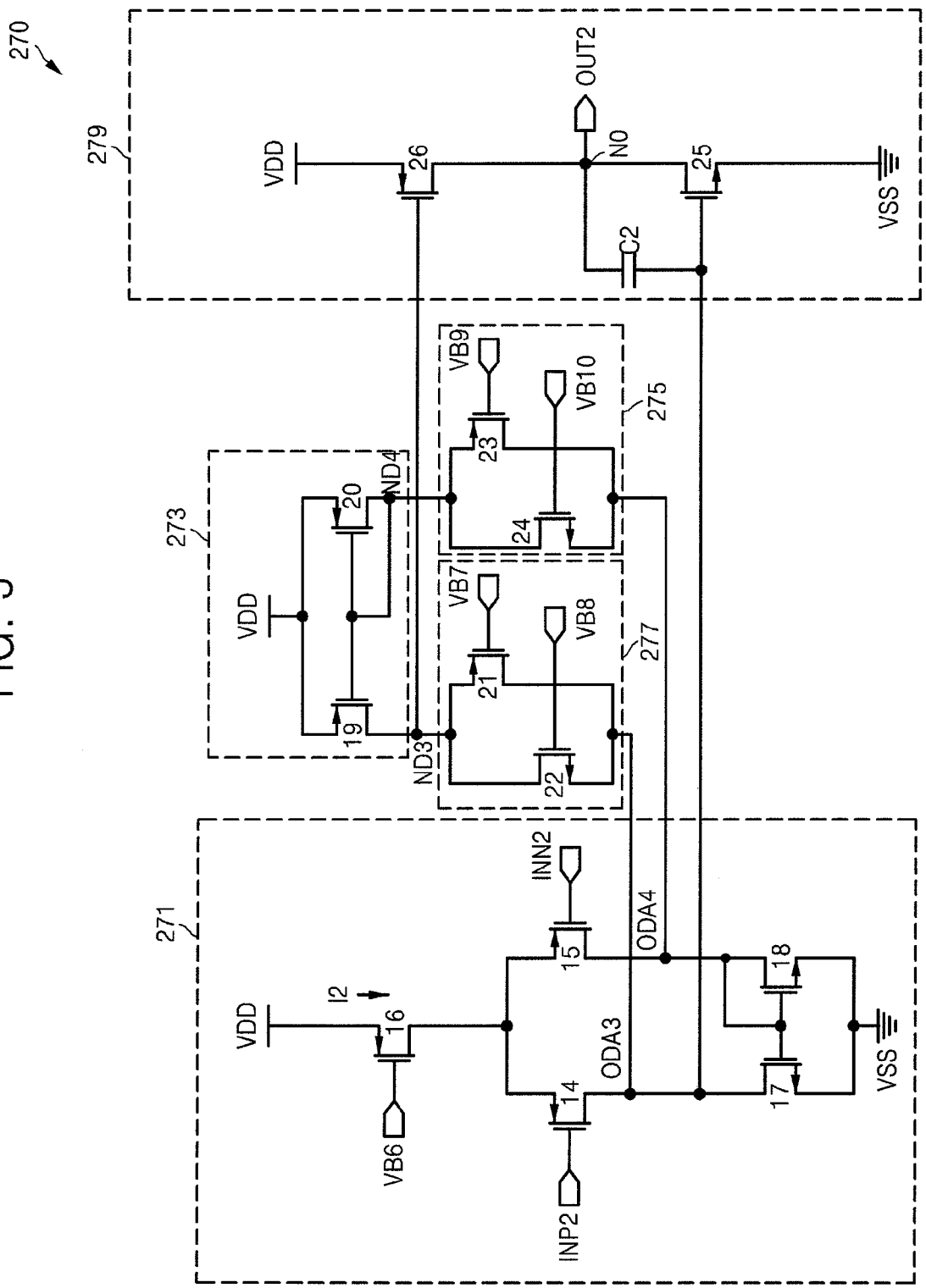
FIG. 5 is a circuit diagram of an OP AMP having a PMOSFET input stage according to an exemplary embodiment of the present invention.
Figure 6:
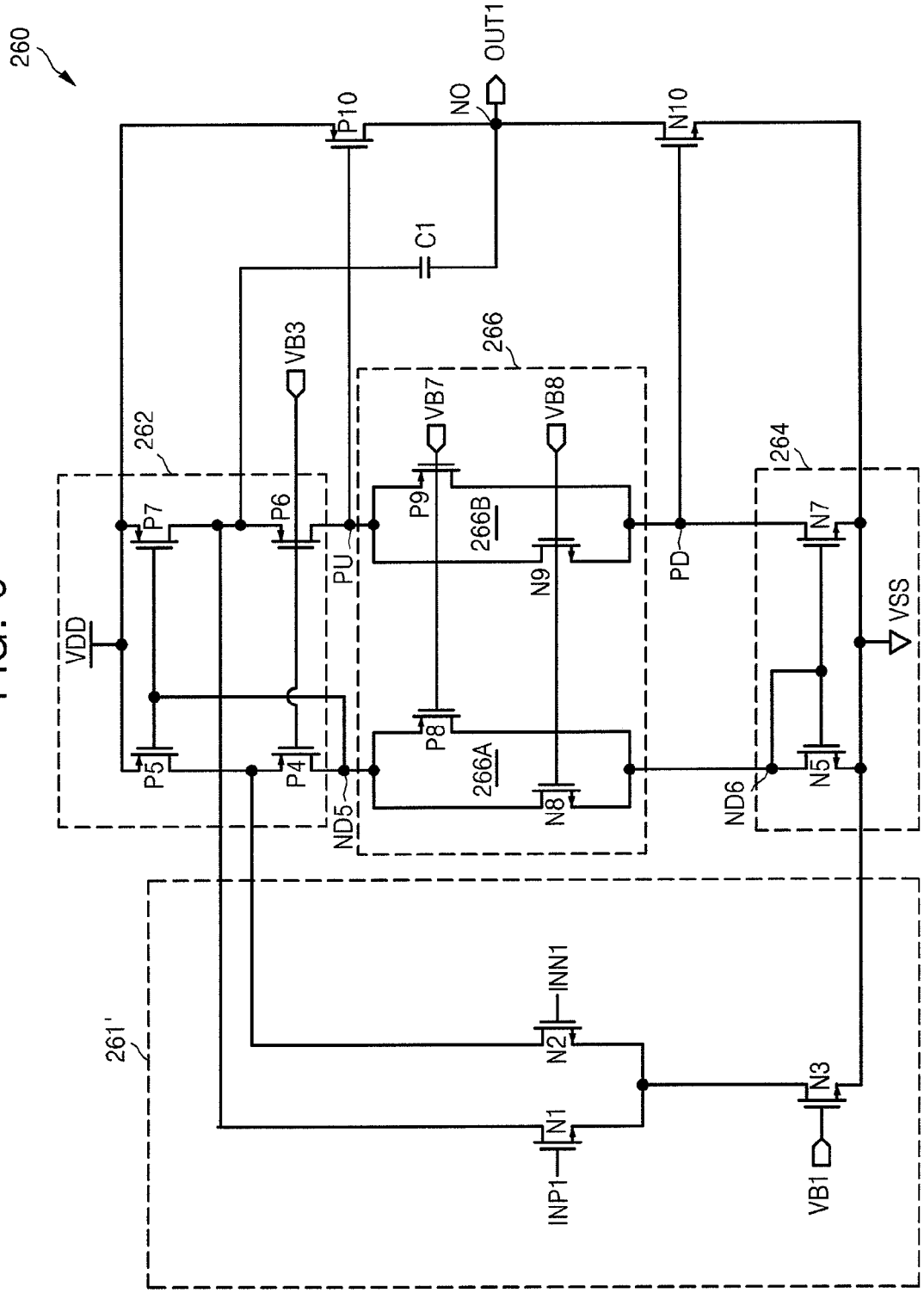
FIG. 6 is a circuit diagram of an OP AMP having an NMOSFET input stage according to an exemplary embodiment of the present invention.
Figure 7:
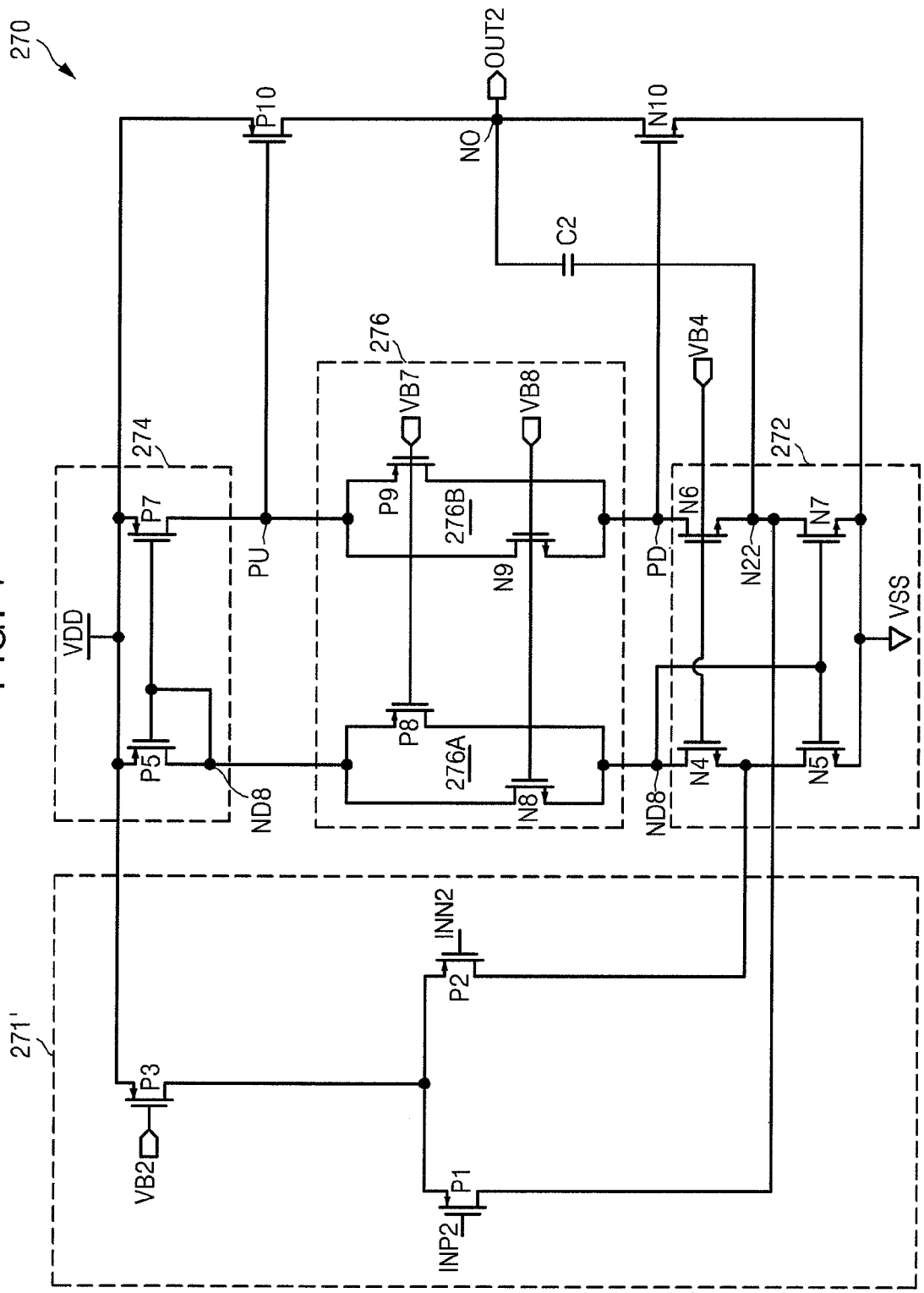
FIG. 7 is a circuit diagram of an OP AMP having a PMOSFET input stage according to an exemplary embodiment of the present invention.

The output buffer 240 according to the exemplary embodiment, however, instead of using a general rail-to-rail OP AMP, includes a two-stage OP AMP 260 of FIG. 4 or 6 having an NMOSFET input stage to improve a falling characteristic and a two-stage OP AMP 270 of FIG. 5 or 7 having a PMOSFET input stage to improve a rising characteristic.

Figure 3:
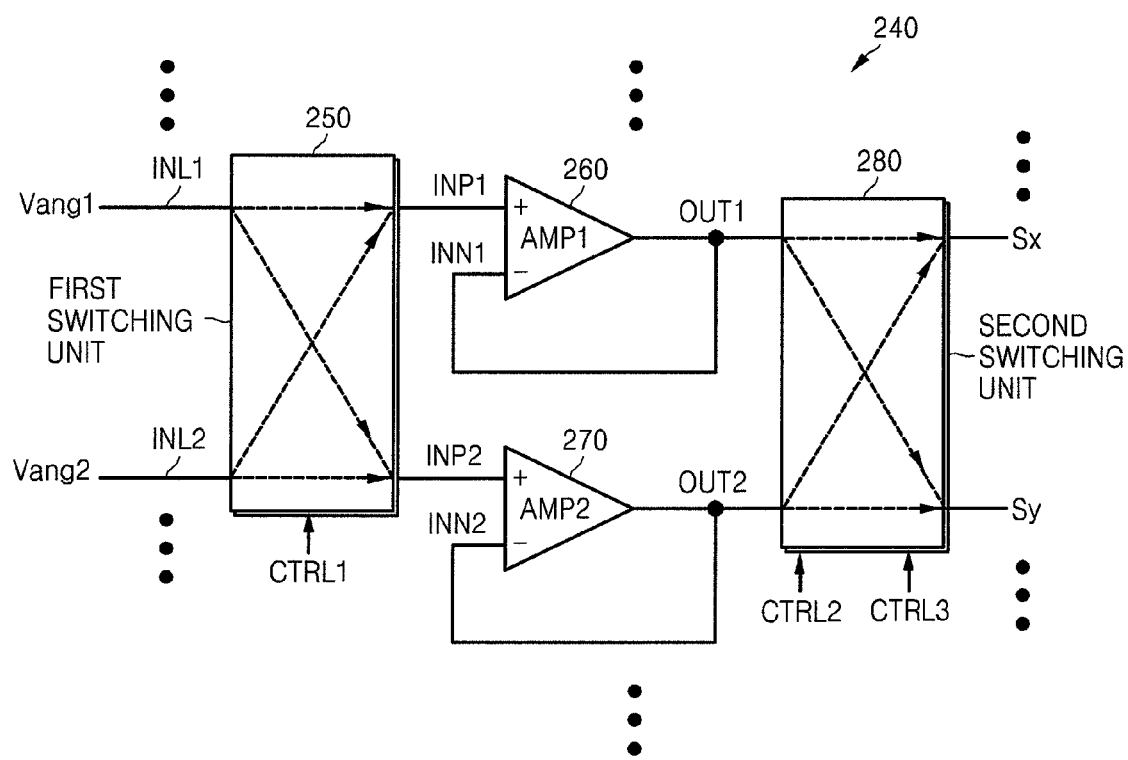
FIG. 3 is a circuit diagram of an output buffer used in the driver of FIG. 2.

FIG. 3 is a circuit diagram of the output buffer shown in FIG. 2. In FIG. 3, for the convenience of explanation, the output buffer 240 includes a first switching unit 250, two two-stage OP AMPs 260 and 270, and a second switching unit 280. Output voltages OUT1 and OUT2 of the two-stage OP AMPs 260 and 270 are respectively fed back to each negative input terminal (−) to function as a unity gain buffer.

A plurality of input lines INL1 and INL2 respectively receive a plurality of analog signals Vang1 and Vang2 whose phases are inverted in a cycle, for example, the cycle of a polarity control signal. The polarity of each of the analog voltages Vang1 and Vang2 is assumed to be complementarily inverted.

The first analog voltage Vang1 input to the first input line INL1 is an analog voltage output to a first source line Sx via the first OP AMP 260. The second analog voltage Vang2 input to the second input line INL2 is an analog voltage output to a second source line Sy via the second OP AMP 270.

The first OP AMP 260 buffers one of the analog voltages Vang1 and Vang2, whose phase is not inverted, to any one of the source lines Sx and Sy. Here, "x" and "y" are natural numbers greater than 1 and less than "n" and "y" is greater than "x" by 1. The second OP AMP 270 buffers one of the analog voltages Vang1 and Vang2, whose phase is inverted, to any one of the source lines Sx and Sy.

In the output buffer 240 of the present embodiment, the first OP AMP 260 is a two-stage OP AMP having an NMOSFET input stage provided to improve a falling characteristic and the second OP AMP 270 is a two-stage OP AMP having a PMOSFET input stage provided to improve a rising characteristic.

The first switching unit 250, in response to a plurality of first switching control signals CTRL1 in a cycle, connects the first input line INL1 and a first input terminal (+) of the first OP AMP 260 and the second input line INL2 and a first input terminal (+) of the second OP AMP 270. Also, the first switching unit 250, in response to the first switching control signals CTRL1 in the cycle, cross-connects the first input line INL1 and the first input terminal (+) of the second OP AMP 270 and the second input line INL2 and the first input terminal (+) of the first OP AMP 260.

The second switching unit 280, in response to a plurality of second switching control signals CTRL2 in a cycle, connects the output terminal of the first OP AMP 260 and the first source line Sx and the output terminal of the second OP AMP 270 and the second source line Sy. Also, the second switching unit 280, in response to the second switching control signals CTRL2 in the cycle, cross-connects the output terminal of the first OP AMP 260 and the second source line Sy and the output terminal of the second OP AMP 270 and the first source line Sx.

Also, the second switching unit 280, in response to a plurality of third switching control signals CTRL3 in a cycle, connects the first source line Sx and the second source line Sy to perform a charge sharing operation.

In the output buffer 240 of FIG. 3, an analog voltage having a non-inverted phase is buffered by the first OP AMP 260 for improving a falling characteristic and an analog voltage having a inverted phase is buffered by the second OP AMP 270 for improving a rising characteristic, and vice versa.

For example, when the first analog voltage Vang1 has a non-inverted phase and the second analog voltage Vang2 has an inverted phase, the first input line INL1 is connected to the first input terminal of the first OP AMP 260 and the second input line INL2 is connected to the first input terminal of the second OP AMP 270 according to the switching operation of the first switching unit 250. In this case, according to the switching operation of the second switching unit 280, the output terminal of the first OP AMP 260 is connected to the first source line Sx and the output terminal of the second OP AMP 270 is connected to the second source line Sy.

When the first analog voltage Vang1 has an inverted phase and the second analog voltage Vang2 has a non-inverted phase, however, the first input line INL1 is cross-connected to the first input terminal of the second OP AMP 270 and the second input line INL2 is cross-connected to the first input terminal of the first OP AMP 260 according to the switching operation of the first switching unit 250. In this exemplary embodiment, according to the switching operation of the second switching unit 280, the output terminal of the first OP AMP 260 is cross-connected to the second source line Sy and the output terminal of the second OP AMP 270 is connected to the first source line Sx.

FIG. 4 is a circuit diagram of an OP AMP having an NMOSFET input stage according to an exemplary embodiment of the present invention. Referring to FIG. 4, the first OP AMP 260 having an NMOSFET input stage 261 includes a current mirror 263, a first bias circuit 265, a second bias circuit 267, and an output stage 269 with a compensation capacitor C1.

A first folded cascode OP AMP circuit including the NMOSFET input stage 261, the current mirror 263, the first bias circuit 265, and the second bias circuit 267 can improve a falling characteristic of the output voltage OUT1. The NMOSFET input stage 261, which is also referred to as a differential amplifier having an active load or a current mirror type differential amplifier includes a plurality of NMOSFETs 1 and 2 connected to a power source that supplies a second power, for example, a ground voltage VSS, through a current source 3 that is controlled by a bias control voltage VB1, and a plurality of PMOSFETs 4 and 5 constituting a current mirror.

The NMOSFETs 1 and 2 and the current source 3 constitute a differential amplifier. When the first OP AMP 260 is used as a unity gain buffer, the output terminal N0 and the second input terminal (−) are connected to each other, as seen in FIG. 3. The differential amplifier amplifies the difference between the first input voltage INP1 and the second input voltage INN1 to generate differential output currents. The current mirror 263 including NMOSFETs 6 and 7 includes a first branch in which a reference current flows and a second branch in which a mirror current, that is, a current obtained by mirroring the reference current, flows.

The first bias circuit 265 is connected between a second output terminal ODA2 of the differential amplifier and a second node ND2 that is connected to the first branch of the current mirror 263. The first bias circuit 265 includes a PMOSFET 10 and an NMOSFET 11 that are connected in parallel between the second output terminal ODA2 and the second node ND2 and regulates the amount of the reference current flowing in the first branch in response to bias control voltages VB4 and VB5 and the voltage of the second output terminal ODA2.

The second bias circuit 267 is connected between a first output terminal ODA1 of the differential amplifier and a first node ND1 that is connected to the second branch of the current mirror 263. The second bias circuit 267 includes a PMOSFET 8 and an NMOSFET 9 that are connected in parallel between the first output terminal ODA1 and the first node ND1 and regulates the voltage of the first branch, that is, the voltage of the first node ND1, in response to bias control voltages VB2 and VB3 and the voltage of the first output terminal ODA1.

The output stage 269 includes a first switch 12 connected between a first power source, for example, a power source for supplying a power voltage VDD, and an output node N0 and a second switch 13 connected between the output node N0 and a second power source. The first switch 12 is turned on/off in response to the voltage of the first output terminal ODA1 of the differential amplifier. The second switch 13 is turned on/off in response to the voltage of the first node ND1. The first switch 12 is implemented by a PMOSFET while the second switch 13 is implemented by an NMOSFET. The compensation capacitor C1 is connected between the first output terminal ODA1 and the output node N0.

Referring to FIGS. 3 and 4, the operation of the first OP AMP 260 for improving the falling characteristic of the output voltage OUT1 is described as follows. First, when a voltage level of the first input signal INP1, for example, a high level or VDD, is higher than a voltage level of the second input signal INN1, for example, a low level or VSS, the NMOSFET 1 is turned on and the NMOSFET 2 is turned off. Thus, the voltage level of the first output terminal ODA1 is shifted to a low level and the voltage level of the second output terminal ODA2 is shifted to a high level. Accordingly, since the PMOSFET 12 of the output stage 269 is turned on, the output voltage OUT1 of the output terminal N0 is shifted to a high level.

When the voltage level of the first input signal INP1 is shifted to a high level, most of the first bias current I1 by the current source 3 flows in the NMOSFET 1. Also, as the voltage level of the second output terminal ODA2 increases, the source-gate voltage of the PMOSFET 10 of the first bias circuit 265 also increases. As the source-drain current of the PMOSFET 10 increases, the drain-source current, that is, the reference current, of the NMOSFET 7 of the first branch of the current mirror 263 also increases. The drain-source current, that is, the mirror current, of the NMOSFET 6 of the second branch of the current mirror 263 is increased by current mirroring.

When the voltage level of the second output terminal ODA2 increases, however, the source-ate voltage of the PMOSFET 5 also decreases so that the source-drain current, that is, the reference current, of the PMOSFET 5 decreases. The source-drain current, that is, the mirror current, of the PMOSFET 4 of the current mirror 263 is decreased by current mirroring. As a result, as electric charges corresponding to the amount of current obtained by subtracting the amount of a current flowing in the NMOSFET 6 from a sum of the amount of a current flowing in the NMOSFET 1 and the amount of a current flowing in the PMOSFET 4 charge the compensation capacitor C1 so that a forward slew is formed. In this exemplary embodiment, the forward slew may signify a case of changing from 0.5 VDD to 0.75 VDD or a case of changing from 0.75 VDD to the VDD.

As the voltage OUT1 of the output terminal N0 is more quickly increased by the current or electric charges charged in the compensation capacitor C1, a forward slew of the output voltage OUT1 is formed. Thus, the first OP AMP 260 according to the present exemplary embodiment has a superior rising characteristic. Also, when the voltage level of the first output terminal ODA1 decreases, the source-gate voltage of the PMOSFET 8 of the second bias circuit 267 decreases so that the source-drain current of the PMOSFET 8 decreases.

Because the drain-source current, that is, the mirror current, of the NMOSFET 6 of the second branch of the current mirror 263 must be constant based on the current mirroring, however, the drain-source current of the NMOSFET 9 of the second bias circuit 267 needs to be increased. Because the gate-source voltage of the NMOSFET 9 of the second bias circuit 267 needs to be increased, the voltage of the first node ND1 decreases.

When the voltage level of the first node ND1 decreases, the NMOSFET 13 is quickly turned off and the current flowing from the output node N0 to the second power source is quickly cut off so that the rising characteristic of the output voltage OUT1 is further improved. The voltage level of the first output terminal ODA1 and the voltage level of the first node N1 are increased or decreased together.

Second, when the voltage level, for example, a low level, of the first input signal INP1 is lower than the voltage level, for example, a high level, of the second input signal INN1, the NMOSFET 1 is turned off and the NMOSFET 2 is turned on. Accordingly, the voltage level of the first output terminal ODA1 is shifted to a high level, and the voltage level of the second output terminal ODA2 is shifted to a low level. Thus, the PMOSFET 12 of the output stage 269 is turned off and the NMOSFET 13 is turned on. As a result, the voltage OUT1 of the output terminal N0 is shifted to the ground voltage VSS.

At this time, most of the bias current I1 flows in the NMOSFET 2. Thus, as the voltage level of the second output terminal ODA2 decreases, the source-gate voltage of the PMOSFET 10 of the first bias circuit 265 decreases. Thus, as the source-drain current of the PMOSFET 10 decreases, the drain-source current, that is, the reference current, of the NMOSFET 7 of the first branch of the current mirror 263 decreases. The drain-source current, that is, the mirror current, of the second branch of the current mirror 266 decreases based on the current mirroring.

As the voltage level of the second output terminal ODA2 decreases, however, the source-gate voltage of the PMOSFET 5 of the current mirror of the differential amplifier increases so that the source-drain current, that is, the reference current, of the PMOSFET 5 increases. The drain-source current, that is, the mirror current, of the PMOSFET 4 of the current mirror of the differential amplifier increases based on the current mirroring. As a result, the amount of current corresponding to the difference between the amount of current flowing in the PMOSFET 4 of the current mirror of the differential amplifier and the amount of current flowing in the NMOSFET 6 of the current mirror 263 must flow from the first output terminal ODA1 to the compensation capacitor C1.

Thus, as the output voltage OUT1 of the output terminal N0 decreases quickly, a reverse slew of the output voltage OUT1 is formed so that the falling characteristic of the output voltage OUT1 is improved. The reverse slew may signify that the first voltage changes from the VDD to 0.75 VDD or from 0.75 VDD to 0.5 VDD. Also, when the voltage level of the first output terminal ODA1 increases, the source-gate voltage of the PMOSFET 8 of the second bias circuit 267 increases so that the source-drain current of the PMOSFET 8 increases.

The drain-source current, that is, the mirror current, however, of the NMOSFET 6 of the second branch of the current mirror 263 must be constant based on the current mirroring. Thus, the drain-source current of the NMOSFET 9 of the second bias circuit 267 needs to be decreased. Because the gate-source voltage of the NMOSFET 9 of the second bias circuit 267 needs to be decreased, the voltage of the first node ND1 increases. The voltage level of the first output terminal ODA1 and the voltage level of the first node ND1 are increased together.

Because the voltage level of the first output terminal ODA1 increases, the PMOSFET 12 is quickly turned off, so that the current supplied from the first power source to the output node N0 is quickly cut off. Also, because the voltage level of the first node ND1 increases, the NMOSFET 13 is turned on so that the voltage level of the output node N0 decreases to the voltage of the first power source, for example, the ground voltage VSS. Thus, the falling characteristic of the output voltage OUT1 of the first OP AMP 260 according to the present exemplary embodiment is further increased.

As described above with reference to FIG. 4, because the voltage of the gate of the NMOSFET 13 and the voltage of the gate of the PMOSFET 12 of the output stage 269 are increased or decreased together, the first OP AMP 260 that is a two-stage OP AMP according to the present exemplary embodiment can perform a class AB operation like a class AB OP AMP, for example, a rail-to-rail OP AMP.

FIG. 5 is a circuit diagram of an OP AMP having a PMOSFET input stage according to an exemplary embodiment of the present invention. Referring to FIG. 5, the second OP AMP 270 having a PMOSFET input stage 271 includes a current mirror 273, a first bias circuit 275, a second bias circuit 277, and an output stage 279, with a compensation capacitor C2.

A second folded cascode OP AMP circuit including the PMOSFET input stage 271, the current mirror 273, the first bias circuit 275, and the second bias circuit 277 improves the rising characteristic of the output voltage OUT1. The PMOSFET input stage 271 which is also referred to as a differential amplifier having an active load or a current mirror type differential amplifier, includes a plurality of PMOSFETs 14 and 15 connected to a first power source through a current source 16 that is controlled by a bias control voltage VB6, and a plurality of NMOSFETs 17 and 18 constituting a current mirror.

The PMOSFETs 14 and 15, and the current source 16 constitute a differential amplifier. When the second OP AMP 270 is used as a unity gain buffer, the output terminal N0 and the second input terminal (−) are connected to each other. The differential amplifier amplifies the difference between the first input voltage INP2 and the second input voltage INN2 to generate differential output currents. The current mirror 273 including PMOSFETs 19 and 20 includes a first branch in which the reference current flows and a second branch in which the mirror current, that is, a current obtained by mirroring the reference current, flows.

The first bias circuit 275 is connected between a second output terminal ODA4 of the differential amplifier and a fourth node ND4 that is connected to the first branch of the current mirror 273. The first bias circuit 275 includes a PMOSFET 23 and an NMOSFET 24 that are connected in parallel between the second output terminal ODA4 and the fourth node ND4 and regulates the amount of the reference current flowing in the first branch in response to bias control voltages VB9 and VB10 and the voltage of the second output terminal ODA4.

The second bias circuit 277 is connected between a first output terminal ODA3 of the differential amplifier and a third node ND3 that is connected to the second branch of the current mirror 273. The second bias circuit 277 includes a PMOSFET 21 and an NMOSFET 22 that are connected in parallel between the first output terminal ODA3 and the third node ND3 and regulates the voltage of the first branch that is, the voltage of the third node ND3, in response to bias control voltages VB7 and VB8 and the voltage of the first output terminal ODA3.

The output stage 279 includes a first switch 25 connected between the second power source and the output node N0 and a second switch 26 connected between the output node N0 and the first power source. The first switch 25 is turned on/off in response to the voltage of the first output terminal ODA3 of the differential amplifier. The second switch 26 is turned on/off in response to the voltage of the second branch, that is, the voltage of the third node ND3. The first switch 25 is implemented by an NMOSFET while the second switch 26 is implemented by a PMOSFET. The compensation capacitor C2 is connected between the first output terminal ODA3 and the output node N0.

Referring to FIGS. 3 and 5, the operation for improving the falling characteristic of the second OP AMP 270 is described as follows. First, when a voltage level, for a example, a low level, of the first input signal INP2 is lower than a voltage level, for example, a high level, of the second input signal INN2, the PMOSFET 14 of the differential amplifier is turned on and the PMOSFET 15 is turned off. Thus, most of the bias current I2 flows in the PMOSFET 14, because the voltage level of the first output terminal ODA3 is shifted to a high level, the NMOSFET 15 is turned on. Because the voltage level of the third node ND3 is shifted to a high level, the PMOSFET 26 is turned off. Thus, the voltage level OUT2 of the output terminal N0 is shifted to a low level.

When the voltage level of the first output terminal ODA3 increases, the gate-source voltage of the NMOSFET 22 of the second bias circuit 277 decreases. Thus, the drain-source current of the NMOSFET 22 decreases. Also, because the voltage level of the second output terminal ODA4 decreases, the gate-source voltage of the NMOSFET 18 of the first branch of the current mirror of the differential amplifier decreases so that the drain-source current, that is, the reference current, of the NMOSFET 18 decreases. The drain-source current, that is, the mirror current, of the NMOSFET 17 of the current mirror of the differential amplifier is decreased by current mirroring.

The amount of current corresponding to the amount of current obtained by subtracting the amount of a current flowing in the current mirror 273 from a sum of the amount of a current flowing in the PMOSFET 14 of the differential amplifier and the amount of a current flowing in the current mirror of the differential amplifier flows from the first output terminal ODA3 to the compensation capacitor C2.

Then, the output voltage OUT2 of the output terminal N0 is quickly decreased so that a reverse slew of the output voltage OUT2 is formed. Thus, the second OP AMP 270 according to the present exemplary embodiment has a superior falling characteristic. Also, when the voltage level of the second output terminal ODA4 decreases, the gate-source voltage of the NMOSFET 24 of the first bias circuit 275 increases so that the drain-source current of the NMOSFET 24 increases. Thus, the mirror current and the reference current of the current mirror 273 increase.

Because the voltage level of the first output terminal ODA3 increases, the drain-source current of the NMOSFET 22 of the second bias circuit 277 decreases. Because the mirror current of the current mirror 276 must be always constant, the voltage of the third node ND3 that is a source voltage of the PMOSFET 21 of the second bias circuit 277 needs to be increased. As the voltage of the third node ND3 increases, the PMOSFET 26 is quickly turned off so that the current supplied from the first power source is quickly cut off. Thus, the falling characteristic of the second OP AMP 270 according to the present exemplary embodiment is further improved.

Second, when the voltage level of the first input signal INP2 is shifted to a high level and the voltage level of the second input signal INN2 is shifted to a low level, the PMOSFET 14 is turned off and the PMOSFET 15 is turned on. Since the voltage level of the first output terminal ODA3 is shifted to a low level, the NMOSFET 25 is turned off. Because the voltage level of the third node ND3 is shifted to a low level, the PMOSFET 26 is turned on. Thus, the output voltage OUT2 of the output terminal N0 is shifted to a high level, that is, to the voltage level of the first power source.

In this exemplary embodiment, most of the bias current I2 flows in the PMOSFET 15. As the voltage level of the first output terminal ODA3 is shifted to a low level, the gate-source voltage of the NMOSFET 22 of the second bias circuit 277 is increased. Thus, the drain-source current of the NMOSFET 22 increases. As the voltage level of the second output terminal ODA4 increases, the gate-source voltage of the NMOSFET 18 also of the current mirror of the differential amplifier increases, so that the drain-source current of the NMOSFET 18 increases. The drain-source current of the NMOSFET 17 increases by reason of the current mirroring.

As the amount of a current corresponding to the difference between the amount of a current flowing in the NMOSFET 17 of the current mirror of the differential amplifier and the amount of a current flowing in the PMOSFET 19 of the current mirror 273 is charged in the compensation capacitor C2, a forward slew is formed. Thus, the rising characteristic of the output voltage OUT2 is improved. As the voltage level of the first output terminal ODA3 decreases, the NMOSFET 25 is quickly turned off. Thus, as the current flowing from the output node N0 to the second power source is quickly cut off, the rising characteristic of the output voltage OUT2 of the second OP AMP 270 according to the present exemplary embodiment is further improved.

As described above with reference to FIG. 5, because the voltage of the gate of the NMOSFET 25 and the voltage of the gate of the PMOSFET 26 move in the same direction, the second OP AMP, which is a two-stage OP AMP, can perform a class AB operation like a class AB OP AMP.

FIG. 6 is a circuit diagram of an OP AMP having an NMOSFET input stage according to an exemplary embodiment of the present invention. Referring to FIG. 6, a two-stage OP AMP 260 having an NMOSFET input stage 261' includes a first current mirror 262, a second current mirror 264, a bias circuit 266, an output stage, and a compensation capacitor C1.

The NMOSFET input stage 261' having the structure of a differential amplifier includes differential NMOSFETs N1 and N2 connected to the second power source through an NMOSFET N3, that is, a power source supplying the ground voltage VSS. The NMOSFET N3 performing a function of a current source is controlled based on the bias control voltage VB1.

The differential amplifier amplifies a difference between the input voltages INP1 and INN1 and outputs differential output currents. When the first OP AMP 260 is used as a unity gain buffer, the output voltage OUT1 is fed back to the second input terminal (−) of the first OP AMP 260, as shown in FIG. 3. That is, the drain of the NMOSFET N1 is connected to the mirror current branch of the first current mirror 262, for example, a branch in which the source-drain current of the PMOSFET P7 flows. The drain of the NMOSFET N2 is connected to a reference current branch, for example, a branch in which the source-drain current of the PMOSFET P5 flows.

The first current mirror 262, which can be implemented by a PMOSFET cascode current mirror, is connected between the first power source, for example, a power source supplying the power voltage VDD, and a first control node PU, and includes a reference current branch and a mirror current branch. That is, the first current mirror 262 is implemented by a plurality of PMOSFETs P4, P5, P6, and P7, the reference current flows through the reference current branch, and the mirror current, that is, a current obtained by mirroring the reference current, flows through the mirror current branch.

The second current mirror 264, which can be implemented by the NMOSFET current mirror is connected between the second power source and the second control node PD. The second current mirror 264 includes a reference current branch in which the reference current flows, for example, a branch in which the drain-source current of the NMOSFET N5 flows, and the mirror current branch in which the mirror current flows, for example, a branch in which the drain-source current of the NMOSFET N7 flows.

The output stage includes a first transistor P10 connected between the first power source VDD and the output node N0 and a second transistor N10 connected between the output node N0 and the second power source. The first transistor P10 can be implemented by the PMOSFET and the second transistor N10 can be implemented by the NMOSFET. The bias circuit 266 is connected between the first current mirror 262 and the second current mirror 264 and biases each of the first and second transistors P10 and N10 in response to the bias control voltages VB7 and VB8, the voltage of the first control node PU, and the voltage of the second control node PD.

The bias circuit 266 includes a first bias circuit 266A and a second bias circuit 266B. The first bias circuit 266A includes a PMOSFET P8 and an NMOSFET N8 connected in parallel between the fifth node ND5 and the sixth node ND6. The second bias circuit 266B includes a PMOSFET P9 and an NMOSFET N9 connected in parallel between the first control node PU and the second control node PD. The bias control voltage VB7 biases the PMOSFETs P8 and P9. The bias control voltage VB8 biases the NMOSFETs N8 and N9.

The first bias circuit 266A is referred to as a floating current source. The second bias circuit 266B biases each of the first and second transistors P10 and N10 so that the first and second transistors P10 and N10 can operate in class AB. The first transistor P10 is turned on/off in response to the voltage of the first control node PU. The second transistor N10 is turned on/off in response to the voltage of the second control node PD. The compensation capacitor C1 is connected between the mirror current branch of the first current mirror 262 and the output node N0.

FIG. 7 is a circuit diagram of an OP AMP having an PMOSFET input stage according to an exemplary embodiment of the present invention. Referring to FIG. 7, a two-stage OP AMP 270 having a PMOSFET input stage 271' includes a first current mirror 272, a second current mirror 274, a bias circuit 276, an output stage, and a compensation capacitor C2.

The PMOSFET input stage 271' having the structure of a differential amplifier includes differential PMOSFETs P1 and P2 connected to the first power source through an PMOSFET P3, that is, a power source supplying the power voltage VDD. The PMOSFET P3 performing a function of a current source is controlled based on the bias control voltage VB2.

The differential amplifier amplifies a difference between the input voltages INP2 and INN2 and outputs differential output currents. When the second OP AMP 270 is used as a unity gain buffer, the output voltage OUT2 is supplied to the second input terminal (−) of the second OP AMP 270. That is, the drain of the PMOSFET P1 is connected to the mirror current branch of the first current mirror 272. The drain of the PMOSFET P2 is connected to a reference current branch.

The first current mirror 272, which that can be implemented by an NMOSFET cascode current mirror, is connected between the second power source, for example, a power source supplying the ground voltage VSS, and a second control node PD, and includes the reference current branch and the mirror current branch. That is, the first current mirror 272 is implemented by a plurality of NMOSFETs N4, N5, N6, and N7, the reference current flows through the reference current branch, and the mirror current, that is, a current obtained by mirroring the reference current, flows through the mirror current branch.

The second current mirror 274, which that can be implemented by the PMOSFET current mirror is connected between the first power source and the first control node PU. The second current mirror 274 includes the reference current branch in which the reference current flows, for example, a branch to which the eighth node ND8 is connected, and the mirror current branch in which the mirror current flows, for example, a branch to which the first control mode PU is connected.

The output stage includes a first transistor P10 connected between the first power source and the output node N0 and a second transistor N10 connected between the output node N0 and the second power source. The first transistor P10 can be implemented by a PMOSFET and the second transistor N10 can be implemented by an NMOSFET.

The bias circuit 276 is connected between the first current mirror 272 and the second current mirror 274 and biases each of the first and second transistors P10 and N10 in response to the bias control voltages VB7 and VB8, the voltage of the first control node PU, and the voltage of the second control node PD.

The bias circuit 276 includes a first bias circuit 276A and a second bias circuit 276B. The first bias circuit 276A includes a PMOSFET P8 and an NMOSFET N8 connected in parallel between the seventh node ND7 and the eighth node ND8. The second bias circuit 276B includes a PMOSFET P9 and an NMOSFET N9 connected in parallel between the first control node PU and the second control node PD. The bias control voltage VB7 biases the PMOSFETs P8 and P9. The bias control voltage VB8 biases the NMOSFETs N8 and N9.

The first bias circuit 276A is referred to as a floating current source. The second bias circuit 276B biases each of the first and second transistors P10 and N10 so that the first and second transistors P10 and N10 can operate in class AB. The first transistor P10 is turned on/off in response to the voltage of the first control node PU. The second transistor N10 is turned on/off in response to the voltage of the second control node PD. The compensation capacitor C2 is connected between the mirror current branch of the first current mirror 272 and the output node N0.

As described above with reference to FIGS. 6 and 7, the voltage of the gate of the PMOSFET P10 and the voltage of the gate of the NMOSFET N10 move in the same direction, the first OP AMP 260 or the second OP AMP 270, which is a two-stage OP AMP, can perform a class AB operation like a class AB OP AMP. The first power source, the second power source, the first switch, and the second switch used in the above description are exemplarily given for the convenience of explanation. The OP AMP according to exemplary embodiments has an effect of improving the falling characteristic or rising characteristic of the output voltage and simultaneously reducing the layout area.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. An operational amplifier comprising:
    a differential amplifier including an active load;
    a current mirror including a first branch and a second branch;
    a first switch connected between a first power source and an output node and switched in response to a voltage of a first output terminal of the differential amplifier;
    a first bias circuit to control an amount of a reference current flowing in the first branch in response to a voltage of a second output terminal of the differential amplifier;
    a second bias circuit to control a voltage of the second branch in which a mirror current flows in response to a voltage of the first output terminal;
    a second switch connected between the output node and a second power source and switched in response to the voltage of the second branch; and
    a capacitor connected between the output node and the first output terminal.

2. The operational amplifier of claim 1, wherein the current mirror is an NMOSFET current mirror, a voltage of the first power source is higher than a voltage of the second power source, the first switch is a PMOSFET, and the second switch is an NMOSFET.

3. The operational amplifier of claim 1, wherein the current mirror is a PMOSFET current mirror, a voltage of the first power source is lower than a voltage of the second power source, the first switch is a NMOSFET, and the second switch is a PMOSFET.

4. The operational amplifier of claim 1, being implemented as a portion of a display driving device.

* * * * *